United States Patent [19]

Assour et al.

[11] 4,292,646

[45] Sep. 29, 1981

[54] SEMICONDUCTOR THYRISTOR DEVICE HAVING INTEGRAL BALLAST MEANS

[75] Inventors: Jacques M. Assour, South Brunswick, N.J.; Theresa I. Bates, Long Pond, Pa.; John R. Bender, Middlesex; John M. S. Neilson, Bridgewater, both of N.J.

[73] Assignee: RCA Corporation, New York, N.Y.

[21] Appl. No.: 757,554

[22] Filed: Jan. 7, 1977

[51] Int. Cl.³ .................................... H01L 29/74
[52] U.S. Cl. .................................... 357/38; 357/13; 357/39; 357/86; 357/51
[58] Field of Search .................... 357/38, 39, 86, 13, 357/51

[56] References Cited

U.S. PATENT DOCUMENTS

| | | | |
|---|---|---|---|
| 3,351,826 | 11/1967 | Hermann | 357/39 |
| 3,360,696 | 12/1967 | Neilson et al. | 357/39 |

FOREIGN PATENT DOCUMENTS 1073560  6/1967  United Kingdom ............... 357/38

Primary Examiner—Joseph E. Clawson, Jr.
Attorney, Agent, or Firm—H. Christoffersen; Robert Ochis

[57] ABSTRACT

A semiconductor thyristor device having a cathode region and an anode region comprises ballast means adjacent thereto. The device further comprises first and second electrode means which are positioned such that only the cathode region and the anode region respectively are contacted thereby. The present structure is compatible with conventional device structures.

8 Claims, 4 Drawing Figures

SEMICONDUCTOR THYRISTOR DEVICE HAVING INTEGRAL BALLAST MEANS

The present invention relates generally to semiconductor thyristor devices and, in particular, relates to such devices which have breakover protection.

Semiconductor thyristor devices are generally characterized as devices which have four regions of alternating conductivities, i.e., NPNP or PNPN. In one such thyristor device, for example a silicon controlled rectifier (SCR), the regions are sequentially designated as a cathode region, a gate region, a base region and an anode region. An SCR is further characterized as a device having two operating states, a high impedance, or blocking state and a low impedance, or conducting state. Such an SCR is usually switched from the blocking state to the conducting state by the application of an appropriate signal to a gate electrode means contacting the gate region. However, an SCR is often switched in the absence of a gate signal when an excessively large voltage potential is applied across the main terminals of the device. This phenomenon is commonly known as breakover and the voltage potential at which it occurs is known as the breakover voltage.

A desirable feature of semiconductor thyristor devices is for the device to be capable of being triggered without damage when a high voltage transient is applied across its main terminals. Such a feature allows the device to be self-protective, i.e., so that it can be used safely in circuits having high voltage transient signals without the necessity of providing external circuitry to reduce the voltage transients.

The regions which are involved in any particular breakdown mechanism may differ depending upon the polarity of the transient signal and different PN junctions can be damaged. That is, if the transient voltage creates a forward bias condition across the SCR, then the PN junction between the gate region and the base region is susceptible to damage. Similarly, if the transient voltage creates a reverse bias condition across the device, then the PN junction between the base region and the anode region is susceptible to damage. The PN junctions mentioned above usually break down in the avalanche mode. Avalanche mode breakdown is usually initiated at a point defect in the material of the device or along an edge termination thereof. When breakdown occurs, the current which flows across a PN junction has a high density at the breakdown point which creates a very high temperature at that location. As known in the art, such a point of high temperature, or hot spot, can damage or destroy a device.

Prior art structures generally provide a low resistance path for the high current which occurs during breakover. The low resistance path usually removes the current from the device via an electrode means. While this mechanism is somewhat effective, conventional devices remain susceptible to damage or destruction due to high current densities even though low resistance paths are provided.

The present novel structure, rather than providing a low resistance path, provides a comparatively high resistance path which distributes or defocuses the breakover current. This results in reducing the current density at any particular spot during breakover.

Figure 1:
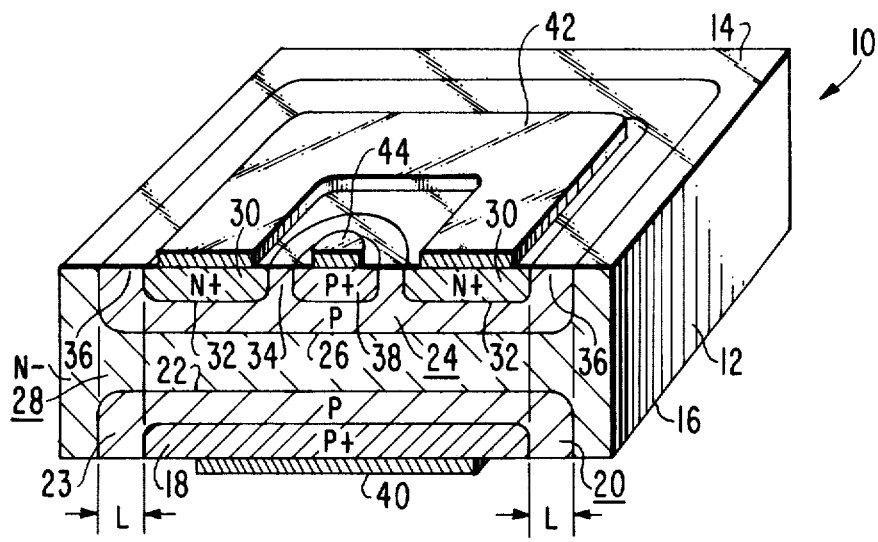
FIG. 1 is a perspective view, partially in section, of one embodiment of the present device, not drawn to scale.

One embodiment of the present structure, which is a silicon controlled rectifier (SCR), is indicated generally at 10 in FIG. 1. The SCR 10 comprises a body 12 of semiconductor material having first and second major opposing surfaces, 14 and 16 respectively, and initially having a one type conductivity. Preferably, the body 12 is silicon, initially having N-type conductivity. It is also preferred that the body 12 initially have an average conductivity carrier concentration on the order of about $10^{14}$ atoms/cm$^3$. While the body is specifically described herein as initially having N type conductivity, it can also initially have P type conductivity so long as all other conductivity types mentioned herein are likewise reversed.

An anode region 18 having boundaries is within the body 12 adjacent the second surface 16 thereof. The anode region 18 has a second type conductivity, in this embodiment P+ type. For example, the anode region 18 can have a surface conductivity carrier concentration on the order of about $10^{19}$ atoms/cm$^3$.

Throughout this specification the plus (+) or (−) sign following a stated conductivity type indicates a region having a comparatively greater or smaller, respectively, conductivity carrier concentration than regions without such a sign. That is, a P+ region indicates a region having a comparatively higher conductivity carrier concentration than a region which is designated, for example, as P type.

A first region 20 having the second type conductivity surrounds the anode region 18 except for where the anode region 18 is adjacent the second surface 16. The anode region 18 being spaced apart from the body 12 by the first region 20. A first PN junction 22 is formed at the interface between the first region 20 and the material of the body 12. The first region 20 preferably has a comparatively lower carrier concentration than the anode region 18. For example, the first region 20 can have a surface carrier concentration on the order of about $10^{17}$ atoms/cm$^3$. Further, it is preferred that the first region 20 extend into the body 12 to a depth which is on the order of about 40 micrometers from the second surface 16. The first region 20 comprises therein a first ballast means 23 which is substantially comprised of that portion of the first region 20 which is adjacent the second surface 16 and which is between the first PN junction 22 and the anode region 18. Preferably the first ballast means 23, i.e., the spacing between the first PN junction 22 and the anode region 18 along the second surface 16, is about 2 to 5 times the depth of the first region 20.

A gate region 24 having the second type conductivity is adjacent the first surface 14 of the body 12. The gate region 24 forms a second PN junction 26 with the body 12 at the interface therewith. Preferably, the gate region 24 has a surface conductivity carrier concentration and depth which is on the same order as that of the first region 20. The gate region 24 is spaced apart from the first region 20 by material of the body 12 which has the initial conductivity type and carrier concentration. The material of the body 12 which retains the initial conductivity type and concentration is hereinafter designated as the base region 28. Preferably, although not necessarily, for reasons discussed below, the second PN junction 26 terminates at the first surface 14.

A cathode region 30 having boundaries and having the one type conductivity is adjacent the first surface 14 and extends into the gate region 24. The cathode region 30 forms a third PN junction 32 with the gate region 24 at the interface therewith. Preferably, the cathode region 30, at the first surface 14, has a substantially rectilinear shape and encloses a portion 34 of the gate region 24. The cathode region 30, near the first surface 14, is enclosed by and spaced apart from the second PN junction 26 by a second ballast means 36. The second ballast means 36 has a surface length similar to that of the first ballast means 24, i.e., it is on the order of between from about 2 to 5 times the depth of the gate region 24. Preferably, for reasons known in the semiconductor art, the cathode region 30 has a comparatively higher conductivity carrier concentration than the base region 28.

A gate trigger region 38 having the second type conductivity is adjacent the first surface 14 and extends into the gate region 24. The gate trigger region 38 is spaced apart from the cathode region 30 by material of the gate region 24. Preferably, the gate trigger region 38 has a comparatively higher conductivity carrier concentration than the gate region 24.

A first electrode means 42 electrically contacts the body 12 within the boundaries of the N+ cathode region 30. In this instance the term 'within' means, as shown in FIG. 1, that the second ballast means 36 which surrounds the cathode region 30 is substantially free of the first electrode means 42. A second electrical means 40 electrically contacts the body 12 within the boundaries of the P+ anode region 18 and a third electrode means 44 electrically contacts the gate trigger region 38. In this instance the term 'within' means, again as shown in FIG. 1, that the first ballast means 23 which surrounds the anode region 18 is substantially free of the second electrode means 40.

The present device can be fabricated using known methods in the art. For example, the first region 20 and the gate region 24 can be formed using known diffusion techniques. The gate trigger region 38 and the anode region 18 may then be diffused into those regions. Further, the first region 20 and the gate region 24 can be diffused simultaneously and the gate trigger region 38 and the anode region 18 can then be formed by simultaneous diffusion techniques.

Figure 2:
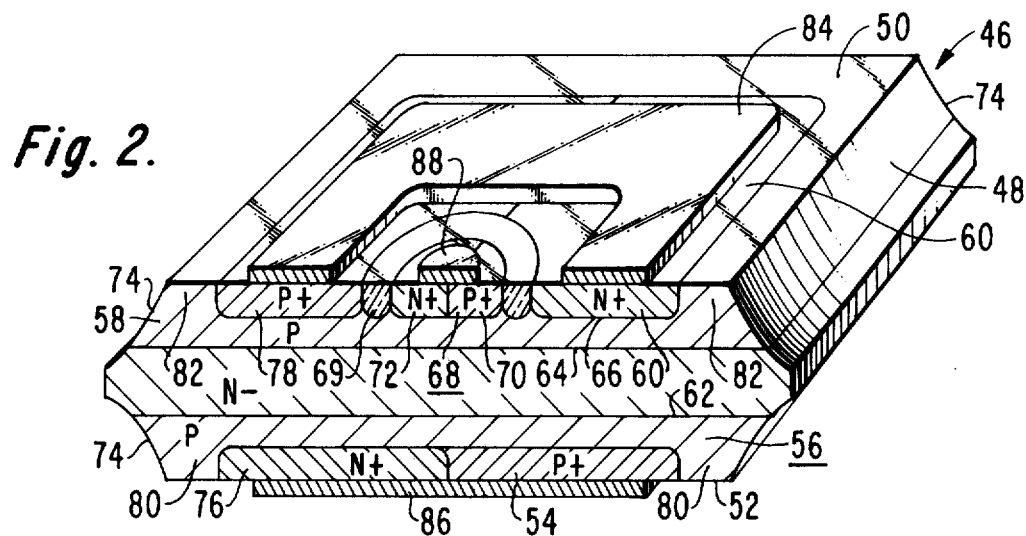
FIG. 2 is a perspective view, partially in section, of another embodiment of the present device, not drawn to scale.

Another embodiment of the present structure, indicated generally at 46 in FIG. 2, comprises regions which are similar to those regions described above for the device 10. Operationally, however, the device 46 is a semiconductor Triac. A Triac, as known in the semiconductor art, can be characterized as two SCR's electrically connected in an inverse parallel relationship. That is, the anode region of one SCR is connected to the cathode region of the other SCR and vice versa.

The device 46 comprises a body 48 of semiconductor material having first and second major opposing surfaces, 50 and 52 respectively, and initially having a one type conductivity, for example, N-type. The device 46 further comprises a P+ type anode region 54, a P type first region 56, a P type gate region 58 and an N+ type cathode region 60 all of which are substantially identical in position and function to the correspondingly named regions of the device 10. Likewise first, second and third PN junctions 62, 64 and 66 respectively, are formed at the corresponding interfaces.

The first and second PN junctions 62 and 64 respectively, in this embodiment extend substantially completely across the body 48 in a direction which is substantially parallel with the first surface 50. These PN junctions terminate at an edge 74 of the body 48.

A gate trigger region 68, comprising a first segment 70 having a P+ type conductivity and a second segment 72 having an N+ type conductivity is adjacent the first surface 50 and extends into the gate region 58. The gate trigger region 68 is substantially completely laterally isolated from the adjacent region by, for example, an isolation moat 69 filled with a dielectric material.

The body 48 is shown in FIG. 2 as having a surrounding mesa type edge 74. This feature is shown for illustrative purposes only. That is, the first and second PN junctions 62 and 64, respectively, can, if desired, terminate at the surfaces 52 and 50 respectively. Accordingly, the shape of the body 48, particularly the edge 74 thereof, is substantially immaterial to the operation of the present novel structure.

The device 46 further comprises an N+ type cathode portion 76 adjacent the second surface 52. The cathode portion 76 is preferably adjacent the anode region 54 and is otherwise substantially completely surrounded by the first region 56. Similarly, there is a P+ type anode portion 78 adjacent the first surface 50. The anode portion 78 is preferably adjacent the cathode region 60 and is otherwise substantially completely surrounded by the gate region 58.

The first ballast means 80 in this embodiment is that material of the first region 56 which is substantially adjacent the second surface 52 and lies between the first PN junction 62 and both the anode region 54 and the cathode portion 76. The second ballast means 82 in this embodiment is that material of the gate region 58 which is substantially adjacent the first surface 50 and lies between both the second PN junction 64 and the cathode region 60 and the anode portion 78.

A first electrode means 84 electrically contacts the body 48 within the boundaries of the cathode region 60 and the anode portion 78. In the device 46 the term 'within', in this instance, as shown in FIG. 2, means that the second ballast means 82 is substantially free of the first electrode means 44. Second electrode means 86 electrically contacts the body 48 within the boundaries of the anode region 54 and the cathode portion 76. Similarly this use of the term 'within' means that the first ballast means 80 is substantially free of the second electrode means 86. Third electrode means 88 electrically contacts both the first and second segments, 70 and 72 respectively, of the gate trigger region 68.

Since an SCR and a Triac operate on substantially the same principles, as mentioned above, the following discussion of the operation of the present novel structure is directed primarily to the SCR.

An ideal PN junction has a uniform avalanche breakdown voltage at every point thereof. Such an ideal PN junction would be able to survive breakover transients having high energy content because the current which flows at breakdown would be evenly distributed over the entire area of the PN junction. That is, no single point along the PN junction would reach a temperature which would cause damage to the crystal until the entire PN junction had reached that temperature.

Figure 3:
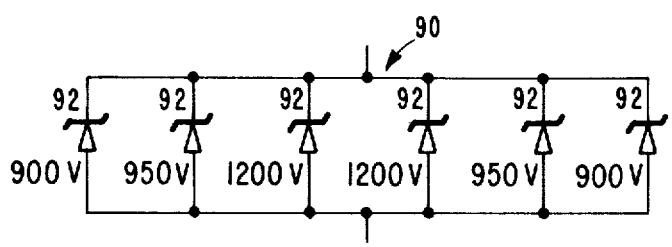
FIG. 3 is a schematic representation of a PN junction of a conventional thyristor device.
Figure 4:
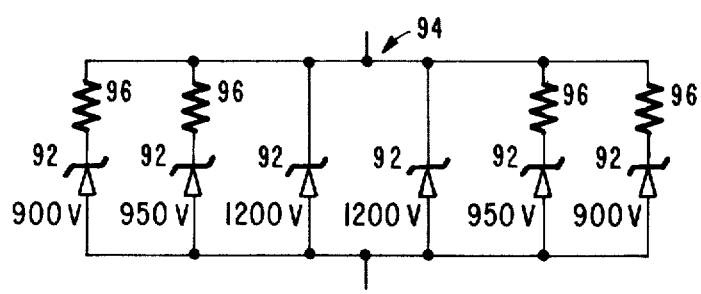
FIG. 4 is a schematic representation of a PN junction of the present thyristor device.

As known in the art, practical PN junctions are far from the ideal and contain non-uniformities and point to point variations therealong. Such a PN junction is schematically represented at 90 in FIG. 3 by a plurality of Zener diodes 92 connected in parallel and having different breakdown voltages. Thus, when a device, 10 or 46 for example, having such a PN junction is exposed to a high energy transient voltage for example, or any other high voltage, the point on the PN junction 90 having the lowest breakdown voltage begins to conduct before any other point conducts. Thus the resulting current is very localized and thus generates considerable heat. This heat can damage or destroy the PN junction 90. The present PN junction structure, schematically represented at 94 in FIG. 4, in addition to the diodes 92 provides a comparatively high resistive region on the P type material side of the PN junction 94. The presence of this high resistivity region effectively provides resistors 96 in series with the PN junction diodes 92. Therefore, when a given point, i.e., a given diode 92 in FIG. 4, on the PN junction 94 breaks down the current which flows thereacross is met with a high resistance. This high resistance restricts the flow of the breakdown current and allows the remainder of the PN junction 94 i.e., the remaining diodes 92 shown in FIG. 4, to break down. Thus, the remainder of the PN junction 94 reaches its breakdown voltage and absorbs a proportional amount of the breakover transient energy. The first and second ballast means, 23 and 36 respectively, of the device 10 provide this resistive function. Since the first and second ballast means, 23 and 36 respectively, are located only along the portions of the first and second PN junctions 22 and 26 respectively, which terminate at the second and first surfaces 16 and 14 respectively, and not in the bulk of the body 12 where the carriers conduct, the normal operating currents of the device are substantially undisturbed. The first and second ballast means, 80 and 82 respectively, of the device 46 operate in a similar manner.

As a design consideration for determining the conductivity of the ballast means of the devices 10 and 46 it should be noted that the power dissipation of a resistive material, in a per unit volume basis, is inversely proportional to the resistivity of the material. Thus, in order to reduce the power density of the device 10 during breakover the conductivity of the material of the ballast means should be as low as possible. The conductivity of a semiconductor material is primarily dependent upon the carrier concentration thereof. Another design consideration in the choice of the conductivity carrier concentration of the first and second ballast means, 23 and 26 respectively, of the device 10 is the resistive temperature coefficient of the material. Preferably, the resistive temperature coefficient is not negative in the ballast means 23 and 36 or in the first and second regions, 20 and 24, respectively. The above condition is desirable since a negative temperature coefficient indicates that the resistivity of the material is the lowest in the hottest area which results in even more current flowing through this particular point and causing it to become even hotter. This is known as thermal runaway. Alternatively, if the resistive temperature coefficient of the ballast means 23 and 36 is positive, that is if the resistivity thereof increases as the temperature increases, the current flowing therethrough is distributed or defocused thereby. This condition substantially completely eliminates the possibility of thermal runaway.

Therefore, regardless of the polarity of the transient signal the first and second PN junctions 22 and 26 respectively, effectively break down substantially uniformly.

Another design consideration is the length L of the ballast means 23 and 36 of the device 10, for example. The effective resistance of the ballast means 23 and 36 is proportional to the length L thereof. Therefore, a larger length L results in a more effective protection. However, to increase the length L means that the overall pellet size is increased, which is undesirable for reasons known in the art. It has been determined that most of the series resistance effectively provided by the ballast means 23 and 36 of the device 10 is in the area immediately surrounding a breakdown spot and that the current flowing through that spot spreads out from this point. Further, beyond a length which is several times greater than the size of the breakdown spot subsequent increases in the length L produce only minor increases in resistance. Thus, an optimum value for the length L of the ballast means 23 or 36 would be on the order of between about two (2) to about five (5) times the size of the typical breakdown spot. It is felt that the dimensions of most PN junction defects are probably on the same order of magnitude as the PN junction depth. Therefore the reasonable length L for ballast means 23 and 36 would be on the order of between about two (2) to about five (5) times the PN junction depth. Hence, by adjusting the length L and conductivity carrier concentration parameters of the ballast means 23 and 36, the thyristor device 10 is provided with breakover protection. These considerations are equally applicable to the Triac device 46.

The present structure provides breakover protection for thyristor devices in a manner which is compatible with the conventional operational features thereof. Such a device structure can be utilized in circuits where there is any danger of damage or destruction of the device from transients, for example, motor control circuits.

What is claimed is:

1. An overvoltage protected semiconductor thyristor device in which breakdown due to overvoltage originates where a PN junction intersects the exterior surface of the semiconductor, said device comprising:

a body of semiconductor material having first and second major opposing surfaces;

a base region within said body and having a one type conductivity;

an anode region within said body and adjacent said second surface of said body, said anode having a second type conductivity;

a first region having said second type conductivity and bounding said anode region within said body, said first region having a comparatively higher resistivity than said anode region;

a gate region within said body and adjacent said first surface and having said second type conductivity;

said base region spacing said first region from said gate region;

said base region and said first region forming a first PN junction where they meet, said first PN junction extending to the exterior surface of said body;

said base region and said gate region forming a second PN junction where they meet, said second PN junction extending to the exterior surface of said body;

a cathode region within said body and adjacent said first surface having said one type conductivity, said cathode region being spaced from said base region by said gate region, said cathode region having a comparatively higher carrier concentration than said gate region;

first electrode means overlying and electrically contacting said cathode region;

second electrode means overlying and electrically contacting said anode region;

said first region having therein a first resistive ballast means for, in the event of an overvoltage breakdown of said first PN junction in the vicinity of where it intersects said exterior surface, limiting the breakdown current which will flow through a localized breakdown region of said first PN junction in the vicinity of where said first PN junction intersects the exterior surface of said body, said first resistive ballast means being that portion of said first region through which breakdown current will flow in passing from said second electrode means to the portion of said first PN junction which is in the vicinity of said exterior surface;

said gate region having therein a second resistive ballast means for, in the event of an overvoltage breakdown of said second PN junction in the vicinity of said exterior surface, limiting the breakdown current which will flow to a localized breakdown region of said second PN junction in the vicinity of where it intersects said exterior surface of said body, said second resistive ballast means being that portion of said gate region through which breakdown current will flow in passing between said first electrode means and the portion of said second PN junction which is in the vicinity of said exterior surface.

2. A semiconductor thyristor device as claimed in claim 1 further comprising;
a gate trigger region within said gate region having said second type conductivity, said gate trigger region having a comparatively higher carrier concentration than said gate region, said gate trigger region being substantially completely surrounded by said cathode region.

3. A semiconductor device as claimed in claim 1 wherein;
said first region has a surface carrier concentration on the order of about $10^{17}$ atoms/cm$^3$ and extends into said body from said second surface a distance on the order of about 40 micrometers.

4. A semiconductor device as claimed in claim 3 wherein said anode region is spaced apart from said first PN junction, at said second surface, by a length L which is between from about 2 to about 5 times the depth of said first region.

5. A semiconductor device as claimed in claim 4 wherein:
said first region and said gate region have substantially the same conductivity carrier concentration and depth; and
said cathode region is spaced apart from said second PN junction by a length which is between from about 2 to 5 times the depth of said gate region.

6. A semiconductor thyristor device as claimed in claim 1 further comprising:
a second cathode portion having said one type conductivity adjacent said initially recited anode region and said second surface and being otherwise substantially completely surrounded by said first region;
a second anode portion having said second type conductivity adjacent said initially recited cathode region and said first surface and being otherwise substantially completely surrounded by said gate region;
said first electrode means also electrically contacting said second anode portion; and said second electrode means also electrically contacting said second cathode portion.

7. A semiconductor thyristor device as claimed in claim 6 further comprising:
a gate trigger region within said gate region comprising a first segment having said one type conductivity and a second segment having said second type conductivity.

8. A semiconductor thyristor device as claimed in claim 6 wherein:
said first resistive ballast means is also in the current path between said second cathode portion and said first PN junction in the vicinity of said external surface; and
said second resistive ballast means is also in the current path between said second anode portion and said second PN junction in the vicinity of said external surface.

* * * * *